United States Patent [19]
Bakker et al.

[11] Patent Number: 5,289,009
[45] Date of Patent: Feb. 22, 1994

[54] CHARGED PARTICLE BEAM SYSTEM AND COOLING DEVICE, A COIL COMPRISING A COOLING MEMBER AND A COOLING MEMBER FOR USE IN SUCH A CHARGED PARTICLE BEAM SYSTEM

[75] Inventors: Johan G. Bakker; Peter E. S. J. Asselbergs, both of Eindhoven, Netherlands

[73] Assignee: U.S. Philips Corporation, New York, N.Y.

[21] Appl. No.: 61,332

[22] Filed: May 13, 1993

Related U.S. Application Data

[63] Continuation of Ser. No. 738,066, Jul. 30, 1991, abandoned.

[30] Foreign Application Priority Data

Aug. 2, 1990 [NL] Netherlands ............... 9001751

[51] Int. Cl.$^5$ ............................................. H01J 3/22
[52] U.S. Cl. ............................ 250/396 ML; 335/210; 335/300
[58] Field of Search ............... 250/396 ML, 396 R; 335/210, 300

[56] References Cited

U.S. PATENT DOCUMENTS

| | | | |
|---|---|---|---|
| 3,394,254 | 7/1968 | Le Poole | 335/210 |
| 4,817,706 | 4/1989 | Miyama et al. | 335/300 |
| 4,896,130 | 1/1990 | Ermilov et al. | 335/300 |

Primary Examiner—Jack I. Berman
Attorney, Agent, or Firm—William L. Botjer

[57] ABSTRACT

A charged particle beam system utilizes a box-shaped cooling member accommodating the lens in order to cool the particle-optical lenses. The cooling medium is circulated between the wall of the lens and the wall of the cooling member, enabling a high transfer of heat by convection. By using a cooling liquid which is undersaturated for air and which is heated prior to its passage through the cooling duct, accumulation of air due to heating can be prevented in the cooling member.

11 Claims, 4 Drawing Sheets

CHARGED PARTICLE BEAM SYSTEM AND COOLING DEVICE, A COIL COMPRISING A COOLING MEMBER AND A COOLING MEMBER FOR USE IN SUCH A CHARGED PARTICLE BEAM SYSTEM

This is a continuation of application Ser. No. 07/738,066, filed Jul. 30, 1991, now abandoned.

BACKGROUND OF THE INVENTION

The invention relates to a charged particle beam system, comprising a source for emitting a beam of charged particles and a focusing device which comprises at least one coil for deflecting the beam, said at least one coil comprising a cooling member which encloses the coil and which comprises a cooling duct for transporting a cooling medium.

The invention also relates to a cooling device, a coil provided with a cooling member and a cooling member suitable for use in such a charged particle beam system.

A charged particle beam system of the kind set forth is known from U.S. Pat. No. 3,394,254.

The cited Patent Specification describes a coil for focusing an electron beam which is formed by a copper tube around which a resin-insulated wire is wound. The outer side of the coil is provided with a copper layer so that the coil fits in a cylindrical opening of a cooling member, the copper layer on the outer side of the coil engaging the inner wall of the cooling member which is also made of copper. The cooling member comprises a cooling duct which is coaxial with the coil and wherethrough water is pumped. The heat developed in the coil is first transported to the cooling duct by conduction by the copper cooling member and is subsequently discharged from the charged particle beam system via convection. In the case of a power dissipation of 30-40 W in the coil, the coil is heated to a temperature of 70° C. Approximately 70% of the heat is then carried off by the cooling water.

SUMMARY OF THE INVENTION

It is an object of the invention to provide a charged particle beam system which comprises an efficiently cooled coil. To achieve this, a charged particle beam system in accordance with the invention is characterized in that the cooling member comprises a jacket which forms a chamber having an inlet opening and an outlet opening, the coil being accommodated in said chamber, the cooling duct comprising a space between the coil and the jacket.

Because water circulates around the coil, an effective heat exchange is realised, the heat developed in the coil being transported directly by convection. Using such a cooling member, approximately 99% of the heat developed in the coil can be carried off by the cooling water. The convection of the heat to the environment is reduced when use is made of the cooling member in accordance with the invention.

An embodiment of a charged particle beam system in accordance with the invention is characterized in that the jacket comprises two concentric, cylindrical walls, a bottom which is connected to the walls and a detachable lid which cooperates with the walls.

The lenses used in charged particle beam systems usually have a toroidal shape, the electron beam passing through the central opening in the torus. The two concentric walls, the bottom and the detachable lid form a toroidal drum in which the coil is situated.

An embodiment of a charged particle beam system in accordance with the invention is characterized in that the lid is provided with an inlet cavity and an outlet cavity which are separated from one another by a shoulder which extends in a circumferential direction of the lid and which cooperates with the coil, the inlet opening and the outlet opening being situated one on each side of the shoulder. The shoulder engages, for example, the coil and divides the cooling duct into two halves so that the cooling medium enters via the inlet opening at one side of the cooling duct and is discharged on the other side of the cooling duct via the outlet opening.

An embodiment of a charged particle beam system in accordance with the invention is characterized in that the shoulder cooperates with an annualar closing member which closes the inlet cavity and the outlet cavity in an end face situated opposite the bottom, which closing member comprises a plurality of inlet openings and outlet openings which are situated to both sides of the shoulder and also comprises a further shoulder which is situated between the inlet and outlet openings and which engages the coil.

The use of the closing member which is clamped between the lid and the coil enables suitable sealing of the cooling duct. A plurality of inlet and outlet openings in the closing member prevents turbulances during inlet and outlet of the cooling medium, so that disturbing vibrations in the coil are avoided.

A further embodiment of a charged particle beam system in accordance with the invention is characterized in that the cooling member comprises an axial flow space which is situated between the coil and the jacket and which forms part of the cooling duct, which flow space is substantially completely separated from the cooling duct in a circumferential direction of the jacket.

Via an inlet opening in the bottom of the jacket, cooling water can flow upwards along the coil in the space between the coil and the jacket, after which it leaves the chamber in the axial direction, via the flow space, through an outlet opening provided in the bottom of the jacket. The flow space can be formed by a tube provided between the jacket and the coil or by two axial shoulders which enclose the flow space in conjunction with a portion of the jacket, situated between the shoulders, and the coil. The discharging of the cooling medium via the flow space counteracts accumulation of air in the chamber and prevents image-disturbing vibrations.

A further embodiment of a charged particle beam system in accordance with the invention is characterized in that the cooling member is made of a plastics material.

The walls and the bottom of the cooling member are substantially not thermally conductive, as opposed to the known cooling members. As a result, the walls, the bottom and the lid can be made of a material having a low thermal conductivity coefficient such as plastics. The walls and the bottom are preferably formed as a single moulded product which may also include the closing member. The closing member is then connected to the walls at a number of points.

Another embodiment of a charged particle beam system in accordance with the invention is characterized in that the charged particle beam system comprises a cooling device with a closed circuit comprising a cooling liquid reservoir, the cooling member and a heat exchanging element which is situated, viewed in a flow direction, between the cooling liquid reservoir and the cooling member in order to cool the cooling liquid prior to its passage through the cooling member. When water is heated from 20° C. to 30° C., the solubility of oxygen decreases from $13.810^{-4}$ mol $l^{-1}$ to $10.310^{-4}$ mol $l^{-1}$ and the solubility of nitrogen decreases from $6.8810^{-4}$ mol $l^{-1}$ to $5.2710^{-4}$ mol $l^{-1}$. The water heated in the cooling duct by the coil will be degassed due to the heating, so that an air bubble could be formed in the cooling duct. This causes undesirable turbulances in the flow pattern so that the coil may start to vibrate which has a negative effect on the image quality. In order to counteract this phenomenon, the cooling liquid in the heat exchanging element is cooled in the absence of air from, for example 27° C. to 20° C. As a result, the cooling medium is capable of taking up more air but, because no air is present in the heat exchanging element, the cooling liquid will be undersaturated. If the water in the coil is not heated further than the temperature in the cooling medium reservoir (27°), no degassing will take place in the cooling member. Should air still be present in the cooling member when it is first put into operation, the air present can be removed in that the unsaturated cooling liquid absorbs the air.

A further embodiment of a charged particle beam system in accordance with the invention is characterized in that the cooling device comprises a further heat exchanging element which is situated, viewed in the flow direction, between the cooling member and the cooling liquid reservoir and which can be by-passed via a valve.

When the coil is not energized, the cooling liquid which has been cooled with respect to the reservoir is not heated in the cooling duct. When the coil is not energized, the heat extracted by the heat exchanging element situated between the cooling liquid reservoir and the cooling member is applied to the cooling liquid again via the further heat exchanging element. When the coil is energized, the further heat exchanging element is by-passed via the valve. The heat exchanging elements preferably form two heat exchangers in conjunction with heat exchanging elements included in a further closed circuit. The further closed circuit contains, for example, the cooling medium freon and includes, for example, a heat exchanger for giving off the heat in the further circuit.

Some embodiments of a charged particle beam system in accordance with the invention will be described in detail hereinafter with reference to the accompanying drawing. Therein:

FIG. 1 is a cross-sectional view of a charged particle beam system,

FIG. 2 is a cross-sectional view of a coil provided with a cooling member in accordance with the invention, FIG. 3 shows a part of a cooling member in accordance with the invention, FIG. 4a shows a cooling member provided with two axial shoulders, FIG. 4b is a sectional view of a coil provided with a cooling member as shown in FIG. 4a, and FIG. 5 shows a diagram of a cooling device for use in a charged particle beam system in accordance with the invention.

DETAILED DESCRIPTION OF THE PREFERRED EMBODIMENTS

Figure 1:
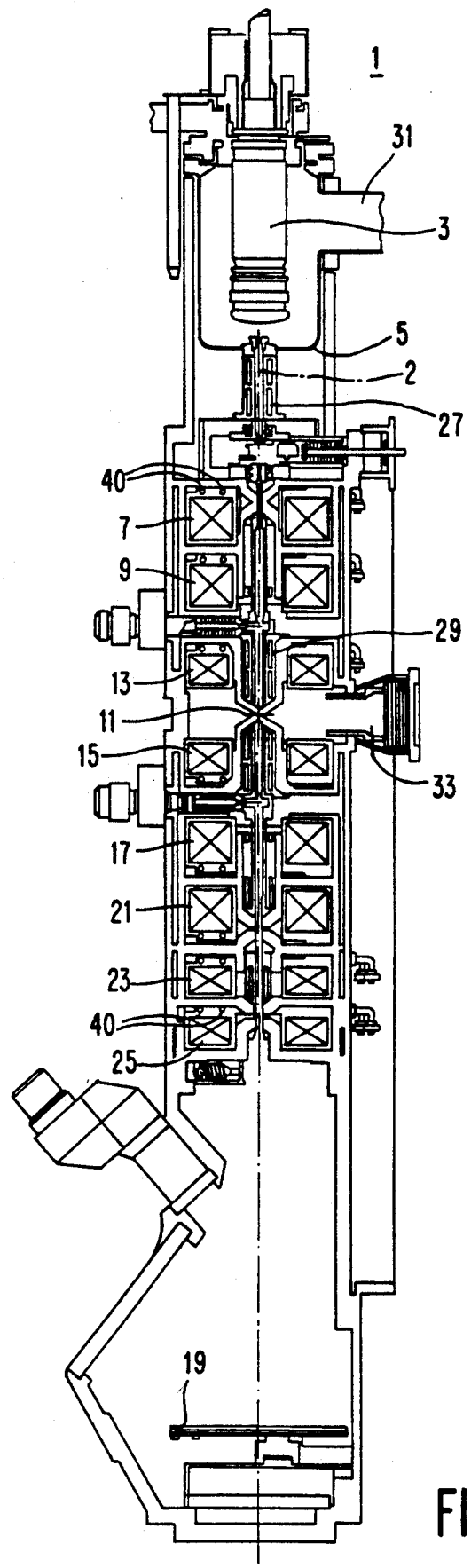

FIG. 1 shows a charged particle beam system 1, notably an electron microscope, comprising a source 3 and a focusing device which is formed by coils 7, 9, 13, 15, 17, 21, 23, 25 which are arranged along an optical axis 2. Electrons emitted by the source 3 are accelerated by an anode 5 and are projected, via a projection lens system 7, 9, on a specimen 11 which is situated in an objective lens 13, 15.

A diffraction image of the specimen 11 can be imaged on a target 19 by energizing a diffraction lens. The enlargement of the electron microscope can be adjusted by energizing an intermediate lens 21. A projection lens system 23, 25 projects the image formed by the lenses 15, 17 and 21 onto the target 19. Along the column there are also arranged source alignment coils 27 and beam tilting coils 29. Via pump connections 31 and 33, a system of vacuum pumps reduces a pressure in the electron microscope to, for example, $10^{-8}$ Torr. In the present embodiment, the lenses which dissipate, for example, a power of 500 W (200 kV, 2.5 mA) via 16000 ampere turns, are cooled in the customary manner. Via a cooling duct 40, the heat transferred to the cooling duct by conduction by the metal enclosing the lens is only partly carried off. A part of the heat, for example 30%, contributes to a heating of the surroundings of the lenses via convection or conduction. In order to counteract thermal drift in the specimen 11 to be examined and to enable the use of a high-power density of the lens so as to reduce spherical aberrations, the lenses 7, 9, 13, 15, 17, 21 and 23 are cooled to, for example, 22° C.

Figure 2:
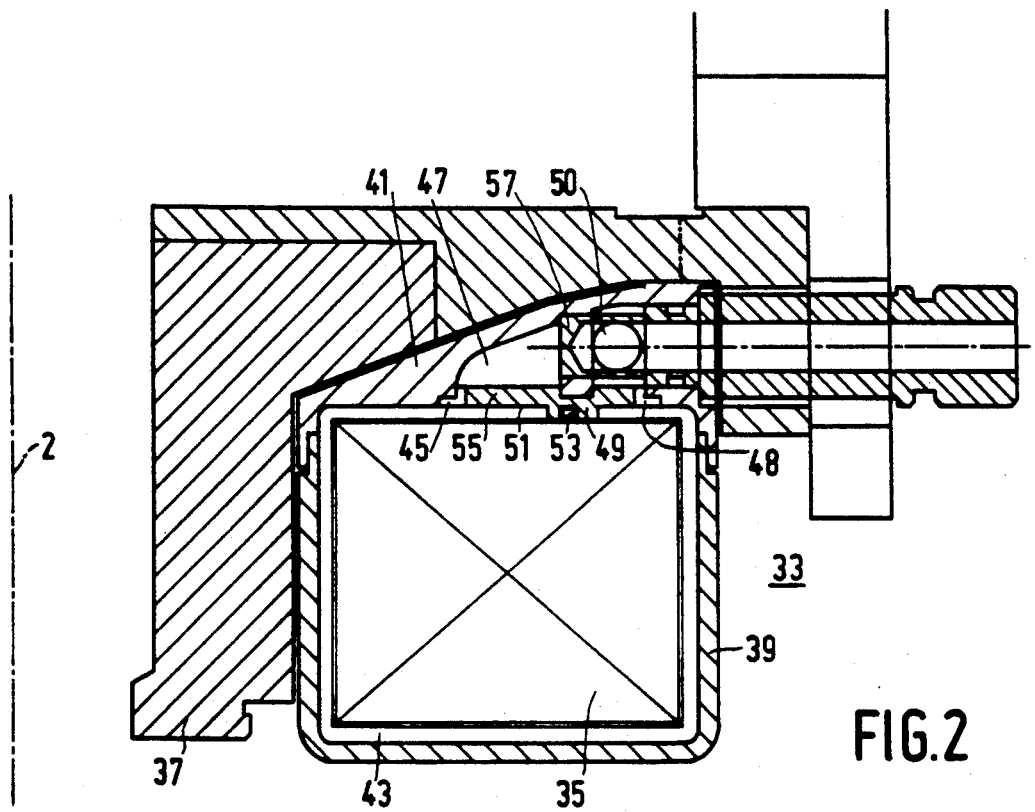

FIG. 2 shows the lens 33, be it only a part thereof which is situated to one side of the optical axis 2. The lens 33 comprises a toroidal coil 35 and a soft-iron pole shoe 37. The windings of the coil 35 are enclosed by a plastics jacket 39. The jacket 39 comprises a lid 41, a cooling duct 43 being arranged between the jacket 39 and the coil 35. Via cams (not shown in the Figure) the coil 35 bears on the bottom 45 of the jacket 39 so that the cooling medium can circulate around the coil 35. Via an inlet opening 45, the cooling medium supplied through an inlet cavity 47 in the lid 41 enters the cooling duct 43 and leaves the cooling duct 43 via an outlet opening 48 so as to be discharged through an outlet cavity 50 provided in the lid 41. The closing member 55, being situated in an end face 51 of the chamber enclosed by the jacket 39, is pressed against the coil 35 by the lid 41. The shoulder 49 bears on the coil 35 and seals the cooling duct 43 via an o-ring 53.

On the upper side of the closing member 55 there is provided a slot which is engaged by a shoulder 57 of the lid, said shoulder separating the inlet cavity 47 and the outlet cavity 49 provided in the lid 41.

Figure 3:
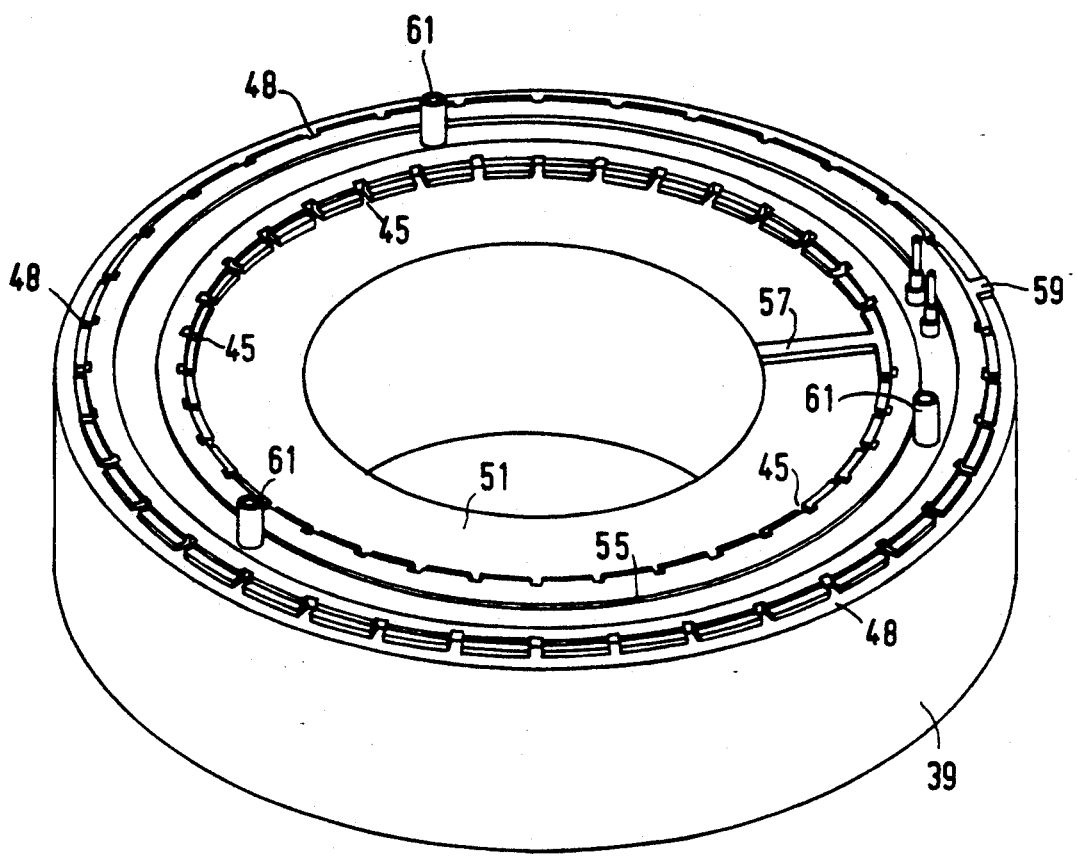

FIG. 3 shows the jacket 39 of the cooling member and the closing member 55 which is situated in the end face 51 and which is connected to the walls of the jacket 39 by way of fixing means 57 and 59. The walls and the bottom of the jacket 39 consist of a single moulded product. The closing member 55 is provided with inlet openings 45 and outlet openings 48 on an inner and an outer circumferential side. Using bushes 61, the lid 41 can be secured to the closing member 55 by means of screws.

When such a cooling member is used in the case of a voltage of 200 kV across the coil, a current density of 5 A mm$^{-2}$ can be used as opposed to a current density of 4 A mm$^{-2}$ as possible according to the known method for cooling the lenses.

Figure 4:
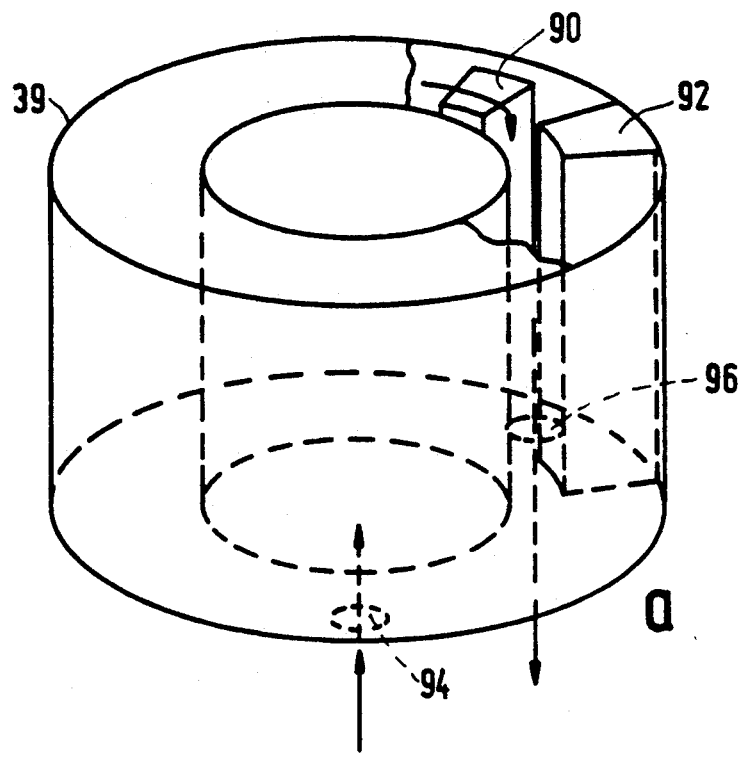
Figure 4:
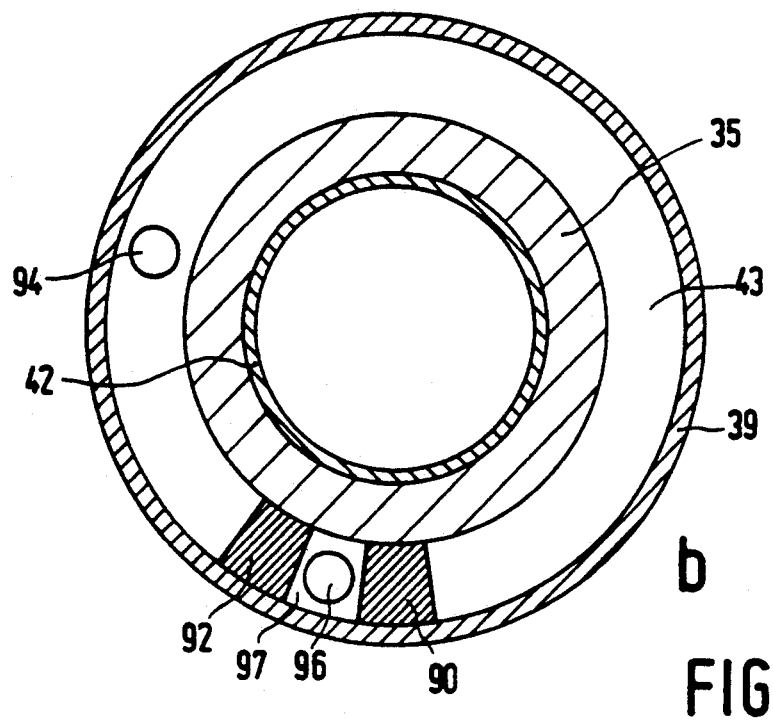

FIGS. 4a and 4b show the jacket 39 of the cooling member, which jacket is provided with two axial shoulders 90 and 92 on the inner side. The cooling medium enters the cooling duct 43 via the inlet opening 94 situated adjacent the shoulders 90 and 92. Shoulder 90 does not extend to the full height of duct 43 to permit coolant flow over its upper end. FIG. 4a does not show the coil 35. After heating by the coil 35, the colling medium flows to the outlet opening 96 situated between the shoulders 90 and 92 over shoulder 90. Instead of the shoulders 92 and 94, the flow space 97 can also be formed by a tube arranged between the coil 35 and the jacket 39.

Figure 5:
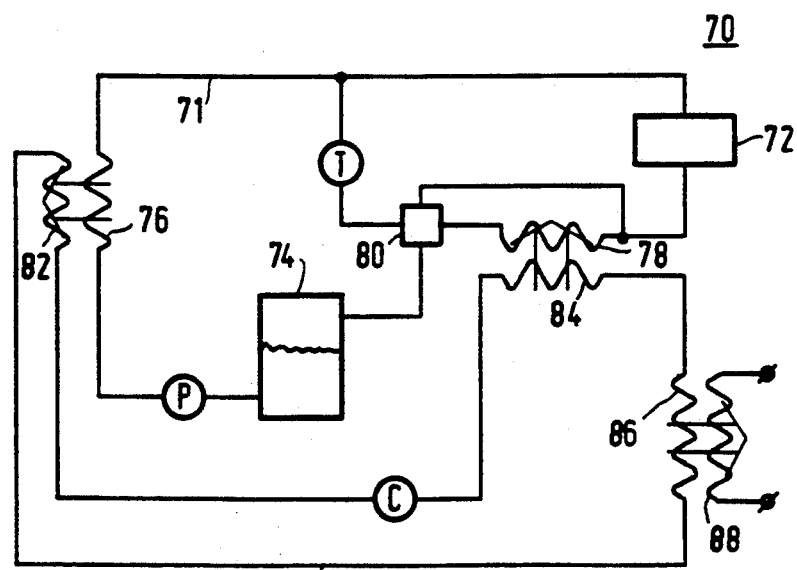

FIG. 5 shows a cooling device 70 for cooling the coil surrounded by the cooling member 72. Air is liable to be released in the cooling duct 43 of the cooling member 72 when the cooling medium, for example water, is heated. The air bubbles disturb the flow of the cooling medium and may cause turbulances which may cause vibration of the lens 33. The deflection of the charged particle beam is thus disturbed, so that inaccurate imaging of an object illuminated by the electron beam takes place in the case of an electron microscope.

In order to prevent segregation of air from the cooling medium, a cooling liquid which is undersaturated with respect to air flows through the cooling member 72. The cooling device 70 comprises a cooling liquid reservoir 74 which is connected, via a pump P, to a first heat exchanging element 76. The heat exchanging element 76 is connected to the cooling member 72 whose outlet opening is connected to a second heat exchanging element 78. The second heat exchanging element 78 is connected to the liquid reservoir 74 and can be bypassed via a controllable valve 80. A further closed circuit 81 is formed by heat exchanging elements 82, 84 and 86 and the compressor C, the heat exchanging elements 82 and 84 cooperating with the heat exchanging elements 76 and 78, respectively, the heat exchanging element 86 forming part of a heat exchanger 88 for discharging the heat from the circuit 81. The cooling liquid temperature in the reservoir 74 is, for example 27° C. In the heat exchanging element 76 the cooling liquid is cooled to a temperature of 20° C. in the absence of air, so that the cooling liquid will be undersaturated. When the cooling liquid is heated to a temperature below 27° C. in the cooling member 72, no air will be released from the cooling liquid. Any air present in the cooling duct 43 of the cooling member 72 will be absorbed by the undersaturated cooling liquid. Via the by-passing of the heat exchanging element 78, the cooling liquid returns to the reservoir 74. The heat absorbed in the circuit 81 is given off via the heat exchanging element 86. If no power is dissipated in the coil, the cooling liquid is returned to the reservoir via the heat exchanging element 78, the heat extracted from the heat exchanging element 76 being applied to the circuit 71 again via the heat exchanging element 84. To achieve this, when the temperature in the circuit 71 drops excessively, the controllable valve 80 is activated via a temperature sensor T, so that the cooling liquid is heated via the heat exchanging element 84.

When a cooling member as shown in the FIGS. 4a and 4b is used, the problem of air accumulation does not occur or only to a very small extent, so that the heat exchanging element 76 can then be dispensed with.

Charged particle beam systems covered by the present invention include scanning electron microscopes, transmission electron microscopes, electron beam writers and testers for semiconductor manufacture, electron or ion beam lithography devices and ion beam implantation devices.

We claim:

1. An electron beam system, comprising a source for emitting a beam of electrons and a focusing device which comprises at least one coil for deflecting the beam, said at least one coil comprising a cooling member which encloses the coil and which comprises a cooling duct for transporting a cooling medium, characterized in that the cooling member comprises a jacket which forms a chamber having an inlet opening and an outlet opening, the coil being accommodated in said chamber, the cooling duct comprising a space between the coil and the jacket and a first closed cooling circuit comprising a cooling liquid reservoir, and a heat exchanging element which is situated, viewed in a flow direction, between the cooling liquid reservoir and the cooling member in order to cool the cooling liquid prior to its passage through the cooling member to cool said member with liquid which is undersaturated with air.

2. An electron beam system as claimed in claim 1, characterized in that the jacket comprises two concentric, cylindrical walls, a bottom which is connected to the walls, and a detachable lid which cooperates with the walls.

3. An electron particle beam system as claimed in claim 2, characterized in that the lid is provided with an inlet cavity and an outlet cavity which are separated from one another by a shoulder which extends in a circumferential direction of the lid and which cooperates with the coil, the inlet opening and the outlet opening being situated one on each side of the shoulder.

4. An electron beam system as claimed in claim 3, characterized in that the shoulder cooperates with an annular closing member which closes the inlet cavity and the outlet cavity in an end face situated opposite the bottom, which closing member comprises a plurality of inlet openings and outlet openings which are situated to both sides of the shoulder and also comprises a further shoulder which is situated between the inlet and outlet openings and which engages the coil.

5. An electron beam system as claimed in claim 1, characterized in that the cooling member includes means to provide an axial flow path for the coolant within the cooling jacket.

6. An electron beam system as claimed in claim 5, characterized in that the axial flow path providing means comprise, on an inner side of the jacket, two axial, neighbouring shoulders of different heights which engage the coil, the flow space being bounded by the shoulders, a portion of the jacket which is situated between the shoulders, and the coil.

7. An electron beam system as claimed in claim 6, characterized in that the shoulders extend as far as the bottom of the jacket with one of the shoulders not extending to the top of the jacket, the inlet opening being situated in a jacket portion situated adjacent the shoulders, the outlet opening being situated in a jacket portion situated between the shoulders.

8. An electron beam system as claimed in claim 1, characterized in that the cooling member is made of a plastics material.

9. An electron beam system as claimed in claim 8, characterized in that the walls and the bottom are formed as a single moulded product.

10. A electron beam system as claimed in claim 1, characterized in that it includes a further heat exchanging element which is situated, viewed in the flow direction, between the cooling member and the cooling liquid reservoir and a valve arranged to selectively bypass said further heat exchanging element.

11. An electron beam system as claimed in claim 10, characterized in that the cooling device comprises a second closed circuit which includes heat exchanging elements which cooperate with the heat exchanging elements in the first closed circuit, and further comprises a heat exchanger for exhausting the heat in the second closed circuit.

* * * * *